United States Patent [19]

Stanley

[11] Patent Number: 5,182,465
[45] Date of Patent: Jan. 26, 1993

[54] AMPLIFIER SELECTOR FOR MAGNETIC RESONANCE IMAGING MACHINE

[75] Inventor: Gerald R. Stanley, Osceola, Ind.

[73] Assignee: Crown International, Inc., Elkhart, Ind.

[21] Appl. No.: 469,090

[22] Filed: Jan. 23, 1990

[51] Int. Cl.⁵ .......................................... H01H 67/00
[52] U.S. Cl. ..................................... 307/115; 307/38; 307/113
[58] Field of Search ............. 200/11 DA, 14; 307/38, 307/112, 113, 114, 115

[56] References Cited

U.S. PATENT DOCUMENTS

| | | | |
|---|---|---|---|
| 2,120,609 | 6/1938 | Horsley et al. | 200/14 |
| 2,551,943 | 5/1951 | Gulow | 200/14 |
| 2,985,726 | 5/1961 | Handel | 200/14 |
| 3,117,303 | 1/1964 | Byrne | 307/115 |
| 3,287,512 | 11/1966 | Gertsch et al. | 200/14 |
| 3,534,315 | 10/1970 | De Nicolà | 200/14 |
| 4,236,104 | 11/1980 | Spence | 200/14 |
| 4,680,547 | 7/1987 | Leue et al. | 324/309 |
| 4,845,613 | 7/1989 | Netter et al. | 364/200 |
| 5,034,692 | 7/1991 | Laub et al. | 324/309 |

FOREIGN PATENT DOCUMENTS 1403927  8/1975  United Kingdom ................ 307/115

*Primary Examiner*—Steven L. Stephan
*Assistant Examiner*—Thomas M. Dougherty
*Attorney, Agent, or Firm*—James D. Hall

[57] ABSTRACT

An amplifier selector for use with a MRI machine having stacked amplifiers. The selector includes a switch assembly carried by each amplifier and controlled by a central controller. Each switch assembly includes a motor for rotating a plurality of switch plates to various predetermined stations. The stations connect the input and output terminals of the slave amplifier to either the X, Y or Z axis of the MRI machine. A fourth station is included to define an off line condition for the amplifier.

12 Claims, 2 Drawing Sheets

AMPLIFIER SELECTOR FOR MAGNETIC RESONANCE IMAGING MACHINE

BACKGROUND OF THE INVENTION

This invention relates to gradient amplifiers and will have specific reference to a switch device for reconfiguring a plurality of stacked gradient amplifiers for use with a nuclear magnetic resonance imaging machine.

Nuclear magnetic resonance imaging (MRI) has revolutionized the medical field in the diagnosis and treatment of patients and has gained wide acceptance since its inception in the early 1970's. As is commonly known, MRI machines use large coils to set up a magnetic field into which the patient is inserted. To generate these large magnetic fields a plurality of power amplifiers associated with each of the coils is required. Typically two or three power amplifiers are associated with each of the three MRI coils or axes.

One of the most significant advances in MRI is the development of fast-scan technology. Fast-scan technology is used to view movable parts of the body, such as the patient's heart or joints. One drawback to using fast scan technology is that the voltage waveforms needed on the fast scan axis have unusually fast rise and fall times which require increased voltage to the coil. Therefore, the hospital or laboratories using fast scan technology have previously had the option of either buying additional amplifiers to be placed on all three axes or to use manual means to configure the system such that enough amplifiers (sufficient voltage) could be placed on the fast scan axis. A problem associated with the option of providing a sufficient voltage on all axes is the cost of additional amplifiers to the hospital. Similarly, there is machine down time when one must manually reconfigure the gradient amplifier.

A further problem experienced in MRI machines in general is associated with common fatigue and breakdown of the amplifiers. A malfunctioning amplifier causes the MRI machine to become inoperative. While it is possible for the hospital to maintain a standby amplifier at considerable cost, the replacement time for a technician to be called to the site and replace the down amplifier will be an additional expense for the hospital.

SUMMARY OF THE INVENTION

The invention hereinafter described eliminates the problems mentioned previously by providing a dynamic gradient amplifier selector associated with each amplifier which is controlled by a central controller. The amplifier selectors are rotated by motors under command of the controller to quickly reconfigure the amplifier's inputs and outputs to place any combination of amplifiers on any of the MRI machine axes. Further, a down or defective amplifier can be switched out of service and, if desired, a spare amplifier switched into service in a manner of seconds after detection to eliminate MRI machine down time.

Therefore, it is an object of this invention to provide for a novel switch for gradient amplifiers.

Another object of this invention is to provide for a switch used with MRI machines for reconfiguring the amplifier configuration with respect to the MRI axes.

Other objects of the invention will become apparent upon a reading of the following description.

DESCRIPTION OF THE PREFERRED EMBODIMENT

The preferred embodiment herein depicted is not intended to be exhaustive or to limit the invention to the precise form disclosed but rather is provided so that others skilled in the art can utilize its teachings.

Figure 1:
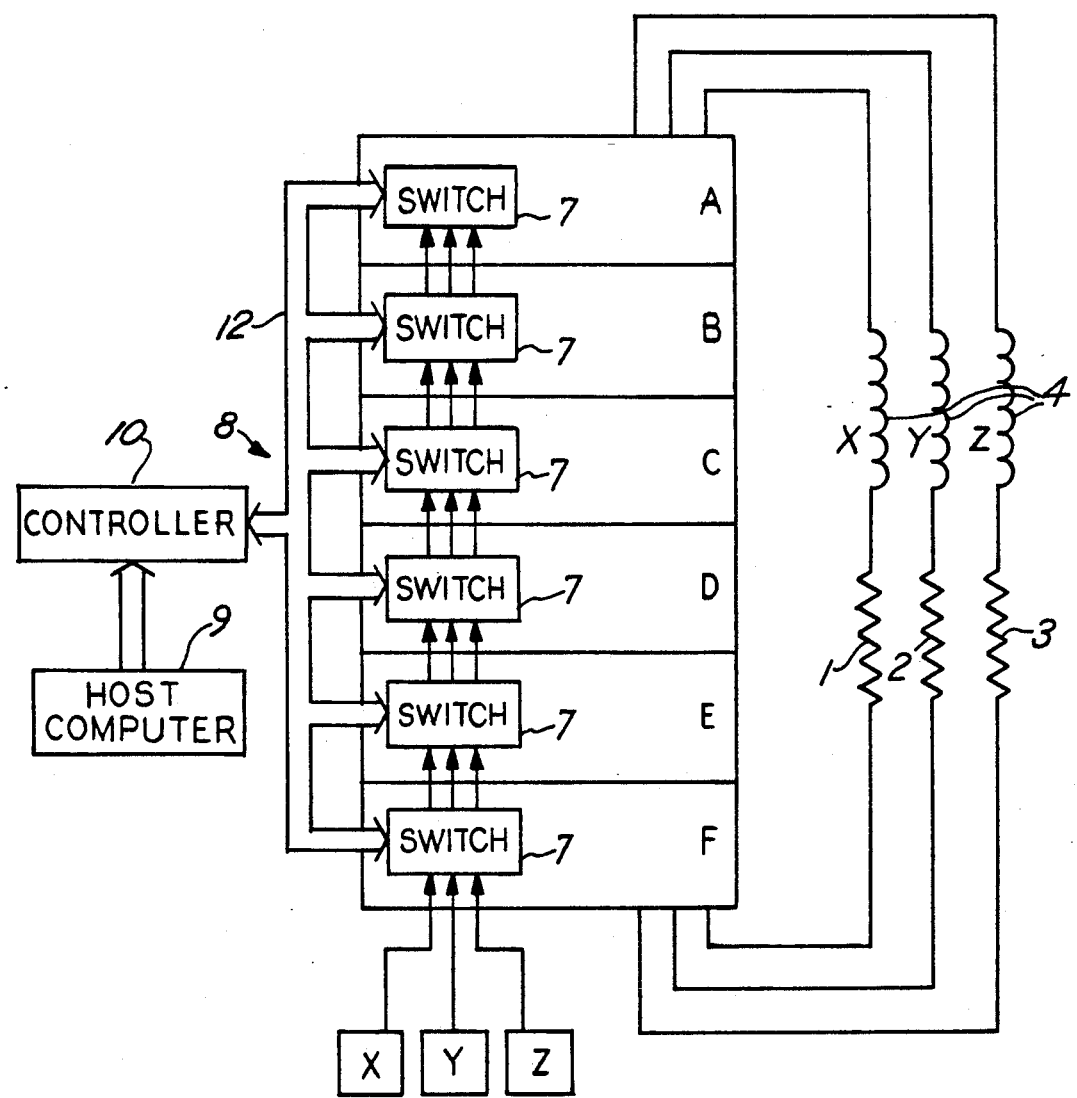
FIG. 1 is a block diagram view of the amplifier selector of this invention shown associated with a plurality of gradient amplifiers and the coils of an MRI machine.

FIG. 1 illustrates a plurality of common power amplifiers A-F (shown stacked) associated with the X, Y and Z axis coils 4 of an MRI machine (not shown). As is typical, each coil has its own internal resistance which is represented by resistors 1, 2 and 3 in FIG. 1. Dynamic gradient amplifier selector 8 includes a common microprocessor controller 10 which is in communication with a switch assembly 7 attached to each amplifier through input/output control lines 12. Each amplifier block A-F includes a switch assembly 7 (see FIG. 2) which includes plates 26, 28 and 30 carried upon the shaft 31 of an associated motor 8. Controller 10 is a common systems control unit, the programming and operation of controller 10 is commonly known in the systems control art and does not constitute a novel portion of this invention. A host computer 9 is connected to controller 10 and passes the required amplifier arrangement to controller 10 in response to a particular scanning operation requested by the operator.

Figure 2:
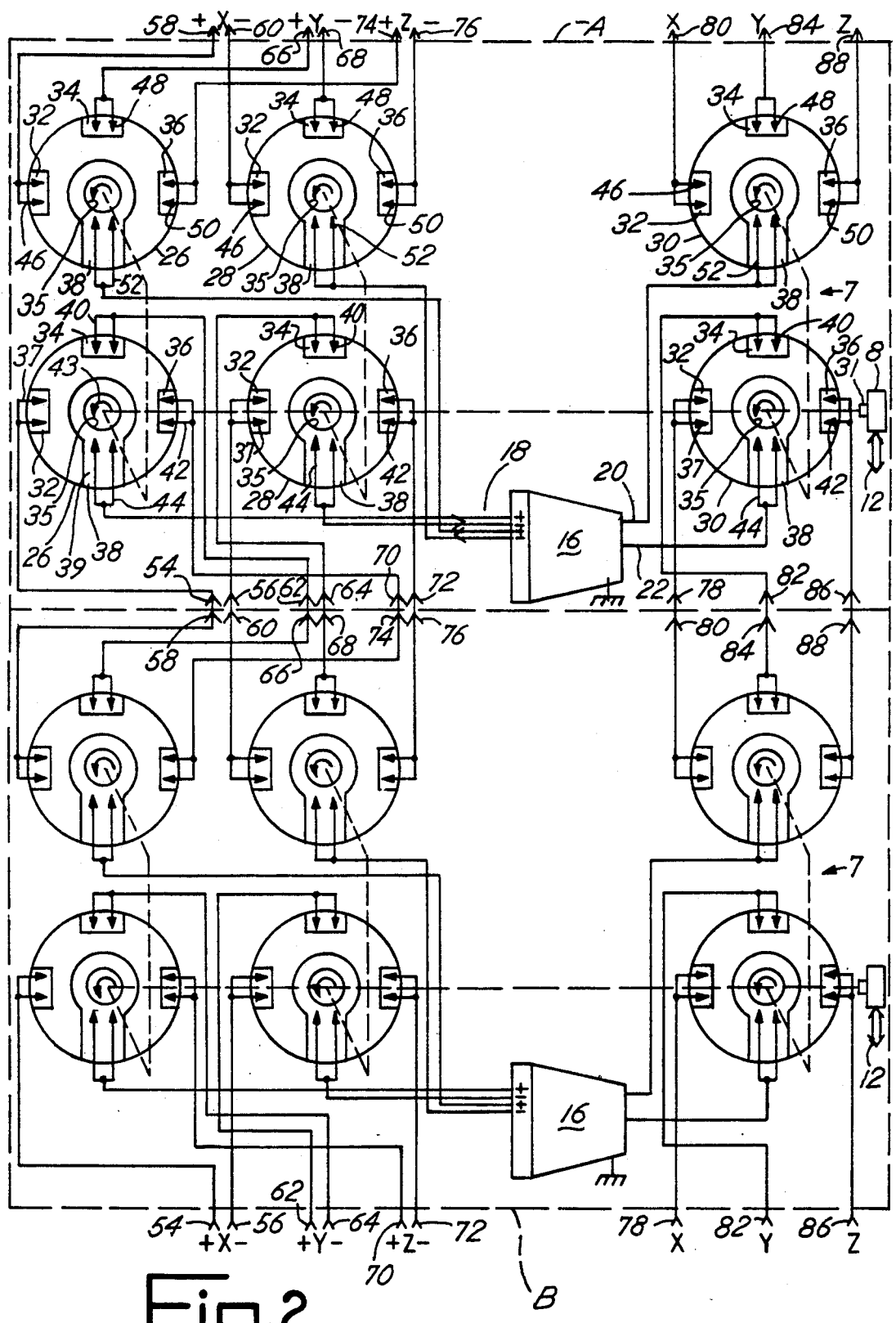
FIG. 2 is a schematical view of two stacked amplifiers with associated selector switches. The switches are illustrated in the offline positions.

As shown in FIG. 2, each amplifier block A-F (only A and B shown) includes a "slave" amplifier 16 having input lines 18 and output line 20 and 22. As mentioned previously, each amplifier block further includes a rotary switch assembly 7 having three, two sided switch plates 26, 28 and 30 carried by a motor shaft 31. Each switch plate is formed from a nonconductive material and includes three conductive pad areas 32, 34 and 36 and fourth conductive area 38 on each side. A portion of conductive area 38 surrounds the center opening 35 of the plate. Each conductive pad 32 on either side of a plate 26, 28 or 30 is electrically connected to pad 32 on the other side of the plate. Likewise, both pads 34 and 36 on each side of a plate are electrically connected. Conductive areas 38 on each side of plates 26, 28 and 30 are electrically isolated from one another. Plates 24, 26 and 28, 30 are attached to motor shaft 31 in a common manner and rotate with the shaft. Preferably, like conductive areas 32, 34, 36 and 38 of plates 26, 28 and 30 are aligned on motor shaft 31.

This dual sided nature of the plate is illustrated schematically in FIG. 2 wherein each side of a plate is shown in vertical alignment and ganged.

Switch assembly 7 further includes four fixed pair of contactors located equally spaced about the periphery of plates 26, 28 and 30 as illustrated in schematic form, only by arrows 37, 40, 42 and 44. The contactors slidably engaging conductive areas 32, 34, 36 and 38 on one side of the plates as the plates are rotated by motor 8. A second set of four fixed contactors 46, 48, 50 and 52 are equally spaced about the periphery of each plate to slidably engage conductive pad areas on the other side of the plates as the plates are rotated by motor 8.

Contacts 37 of plates 26 and 28 are connected to the positive and negative X-axis terminals 54, 56 respectively. Contacts 46 associated with plates 26 and 28 are connected to positive and negative X-axis output terminals 58, 60 respectively. Contacts 40 associated with plates 26 and 28 are connected to positive and negative Y-axis input terminals 62, 64 respectively. Contacts 48 associated with plates 26 and 28 are connected to Y-axis output terminals 66, 68 respectively. Contacts 42 associated with plates 26 and 28 are connected to the positive and negative input Z-axis terminals 70, 72 respectively. Contacts 50 associated with plates 26 and 28 are connected to Z-axis output terminals 74, 76. Contacts 44 and 52 associated with each side of plates 26 are connected to the positive signal input and positive signal output terminals on the slave amplifier 16 as illustrated. Contacts 44 and 52 associated with each side of plates 28 are connected to the negative signal input and output terminals of the slave amplifier 16 as illustrated. Contacts 37 associated with plate 30 are connected to an X-axis power input voltage terminal 78. Contacts 46 associated with plate 30 are connected to X-axis power output voltage terminal 80. Contacts 40 associated with plate 30 are connected to the Y-axis power input voltage terminal 82 and contacts 48 associated with plate 30 are connected to Y-axis power output voltage terminal 84. Contacts 42 associated with plate 30 are connected to the Z-axis power input voltage terminal 86. Contacts 50 associated with switch plate 30 are connected to the Z-axis power output terminal 88. Gradient slave amplifier 16 is known in the industry. Therefore, its specific operation and circuitry need not be described for this invention. It will suffice to say that amplifier 16 includes positive and negative signal input terminal which control the amplifiers power output at the output terminals 20, 22. Amplifier 16 also includes positive and negative signal output terminals which are internally connected to output terminals 20, 22 for outputting a signal representative of the power signal at terminals 20, 22.

Referring to FIG. 2 it should be noted for ease of understanding with regard to plates 26, 28 that plate 26 switches the positive signal input and output. Plate 28 switches the negative signal input and output.

When two or more amplifiers are connected as illustrated schematically in FIG. 2 the output connectors of one switch assembly are connected to the input connectors of the above adjacent switch assembly. In essence, each switch assembly is in series with the above or below similar switch assemblies. Such arrangement is commonly referred to in the trade as stacking.

In operation, the MRI system operator (radiologist) determines the number of amplifiers required on each X, Y and Z axis and inputs such information to controller 10 by way commands given by the host computer 9 which responds to imaging requests. Controller 10 then appropriately signals motors 8 in a common manner to rotate in the direction of arrows 43 to connect amplifier blocks A-F to the proper axes of the MRI machine as determined by the operator. The slave amplifier 16 within each block is connected to the appropriate axis by conductive extension 39 of each plate within the amplifier's switch assembly being rotated into alignment with either contactor 37 for X axis, 40 for Y axis, 42 for Z axis. To disconnect an amplifier from all axes extension 39 is rotated into alignment with contact 44. The voltage from voltage sources X, Y or Z are passed to the slave amplifier 16 as determined by the orientation of conductive areas 38. For example if the lower amplifier block B of FIG. 2 were to be connected to the X axis, conductive areas 38 on each side of plate within block B would be rotated into alignment with contacts 37, 46. So positioned the positive X voltage and negative X voltage would be connected to the positive and negative signal inputs for the slave amplifier 16. A current path is therefore established from positive X voltage supply terminal 54, through contacts 37, extension 39, contact 44 to positive signal input terminal on slave amplifier 16. All other control voltages would be passed upwardly to the next amplifier block without disturbance. The output of the amplifier at plate 30, would be connected in series with the X axis coil and any other amplifier placed on the X axis. In use, common position indicators (not shown) will be used to feed switch position information back to controller 10.

It can therefore be seen that using this invention one can change the amplifier association with an axis on the MRI machine very quickly. Any number of amplifiers may be aligned with the X, Y or Z axes as the use dictates. Further, if a "down" amplifier is experienced, that amplifier can be switched to an off-line status and another amplifier switched into operation to allow the machine to continue functioning. The down amplifier could not be repaired without costing a hospital or laboratory lost scanning revenue.

It should be noted that the amplifier and switch configuration illustrated is a series configuration. Therefore amplifier signals are passed in series to the next amplifier block and the amplifier outputs connected in series. However, this invention has equal application for a parallel configuration.

It should also be understood that although only six amplifiers A-F are illustrated, this invention may be used with any number of amplifiers and associated switch assemblies. It should be further understood that this invention is not to be limited to the details above but may be modified within the scope of the appended claims.

I claim:

1. A selector for connection to a gradient amplifier having signal input terminals and power output terminals, said selector including multiple switch means for selectively connecting said amplifier input terminals to one of a plurality of voltage sources and said power output terminals to one of a plurality of loads, said multiple switch means including a plurality of rotatable non-conductive plates, each of said plates having a conductive pad on each side, a plurality of first fixed in location contacts positioned about each of said plates, said contacts being operatively associated with a plurality of output terminals of said voltage sources and adapted for connection to said amplifier output terminals, said first fixed contacts being slidably engagable with a said pad on one side of said plates, a plurality of second fixed in location contacts positioned about each of said plates, said second fixed contacts being operatively associated with a plurality of input terminals of said first multiple switch means and adapted for connection to said amplifier input terminals, said second fixed contacts being slidably engagable with a said pad on the other side of said plates, and means for rotating said plates relative to said first and second fixed contacts.

2. The selector of claim 1 further including a second multiple switch means for connection to a second gradient amplifier having signal input terminals and power output terminals, said second multiple switch means for selectively connecting said second amplifier input terminals to one of said plurality of voltage sources and said power output terminals to one of said plurality of loads, said second multiple switch means including a plurality of rotatable non-conductive plates, each of said plates having a conductive pad on each side, a plurality of other first fixed in location contacts positioned about each of said plates, said first fixed contacts of said second multiple switch means being operatively associated with a plurality of output terminals of said voltage sources and adapted for connection to said second amplifier output terminals, said first fixed contacts of said second multiple switch means being slidably engagable with a said pad on one side of said plates, a plurality of other second fixed contacts positioned about each of said plates, said other second fixed contacts of said second multiple switch means being operatively associated with a plurality of input terminals of said second multiple switch means and adapted for connection to said second amplifier input terminals, said second fixed contacts of said second multiple switch means being slidably engagable with a said pad on other side of said plates, and second means for rotating said second multiple switch means plates relative to said other first and second fixed contacts, said first fixed contacts of said second switch means and said second fixed contacts of said first mentioned switch means are operatively associated with one another.

3. The selector of claim 2 further including a third multiple switch means for connection to a third gradient amplifier having signal input terminals and power output terminals, said third multiple switch means for selectively connecting said third amplifier input terminals to one of said plurality of said voltage sources and output terminals of said third amplifier to one of said loads, said third multiple switch means including a plurality of rotatable non-conductive plates, each of said plates of said third multiple switch means having a conductive pad on each side, a plurality of still another first fixed in location contacts positioned about each of said plates, said first fixed contacts of said third multiple switch means being operatively associated with a plurality of output terminals of said voltage sources and adapted for connection to said third amplifier output terminals, said first fixed contacts of said third multiple switch means being slidably engageable with a said pad on one side of said third multiple switch means plates, a plurality of still another second fixed in location contacts positioned about each of said plates, said second contacts of said third multiple switch means being operatively associated with a plurality of input terminals of said third multiple switch means and adapted for connection to said third amplifier input terminals, said second fixed contacts of said third multiple switch means being slidably engageable with a said pad on another side of said plates and third means for rotating said third multiple switch means plates relative to said last mentioned first and second fixed contacts, said first fixed contacts of said third multiple switch means and said second fixed contacts of said second switch means being operatively associated with one another.

4. The selector of claim 3 wherein said first and second plurality of fixed contacts of each multiple switch means constituting aligned pairs of contacts on opposite sides of each said plate, each of said aligned pairs of contacts define stations about said plates.

5. The selector of claim 4 wherein each multiple switch means further includes a plurality of conductive pads positioned on each side of said plates, wherein said first mentioned conductive pad is positioned at one of said stations said plurality of conductive pads being positioned at the other said stations.

6. The selector of claim 1 wherein said rotating means includes a motor having a rotatable shaft, said plurality of non-conductive plates being carried by said shaft, said rotating means further including a means operatively associated with said motor for controlling rotation of said shaft.

7. A selector for connection to a gradient amplifier having signal input terminals and output terminals, said selector including a first multiple switch means for selectively connecting said amplifier input terminals to one of a plurality of voltage sources and said output terminals to one of a plurality of loads, said first multiple switch means including a plurality of rotatable non-conductive plates, and means for rotating said plates, each of said plates having a conductive pad on each side, a plurality of first fixed in location contacts positioned about each of said plates, said contacts slidably engaging one side of said plates, a plurality of second fixed in location contacts positioned about each of said plates, said second contacts slidably engaging another side of said plates, a second multiple switch means for connection to a second gradient amplifier having signal input terminals and power output terminals, said second multiple switch means for selectively connecting said second amplifier input terminals to one of said plurality of voltage sources and said output terminals to one of said plurality of loads, said second multiple switch means including a plurality of rotatable non-conductive plates, and means for rotating said plates of said second multiple switch means, each of said second multiple switch means plates having a conductive pad on each side, a plurality of other first fixed in location contacts positioned about each of said second multiple switch means plates, said contacts slidably engaging one side of said second multiple switch means plates, a plurality of other second fixed in location contacts positioned about each of said second multiple switch means plates, said second contacts of said second switch means slidably engaging another side of said second multiple switch means plates, said first fixed contacts of said second switch means being connected to said second fixed contacts of said first switch means.

8. The selector of claim 7 further including a third multiple switch means for connection to a third gradient amplifier having signal input terminals and power output terminals, said third multiple switch means for selectively connecting said third amplifier input terminals to one of said plurality of said voltage sources and said output terminals of said third amplifier to one of said loads, said third multiple switch means including a plurality of rotatable non-conductive plates, and means for rotating said plates of said third multiple switch means, each of said plates of said third multiple switch means having a conductive pad on each side, a plurality of still another first fixed contacts positioned about each of said third multiple switch means plates, said contacts slidably engaging one side of said third multiple switch means plates, a plurality of still another second fixed contacts positioned about each of said third multiple switch means plates, said second contacts slidably engaging another side of said third multiple switch means plates, said first fixed contacts of said third multiple switch means being connected to said second fixed contacts of said second switch means.

9. In combination, a switch and a machine having three coils defining X, Y and Z axes, said machine further including an gradient amplifier having signal input terminals and power output terminals for energizing one of said axes responsive to a control signal from said machine, said switch being operatively associated with said amplifier for selectively connecting said input terminals to said control signal and said output terminals to said one axis, said switch including non-conductive rotatable switch plates having first and second sides, each of said switch plates having a plurality of peripheral conductive pads positioned on said first and second sides, each plate defining a central opening, one of such conductive pads on each first and second plate sides including an extension which includes a conductive portion about said central opening, a plurality of electrically isolated fixed in location contacts positioned about each plate on its said first and second sides and defining opposing pairs of contacts, wherein opposing pairs of said contacts define a station, said switch further including a means for rotating said switch plates to align said one of said conductive pads with one of said predetermined stations, one of said contacts on each of said side extending inwardly to slidably engage said conductive portion about said opening on said first and second sides, means connected to said plates for rotating said switch plates to selectively position said one of said conductive pads at a predetermined station to selectively connect said amplifier voltage input terminals and output terminals to one of said axes.

10. A selector for connection to a gradient amplifier having signal input terminals and power output terminals, said selector including multiple switch means for selectively connecting said amplifier input terminals to one of a plurality of voltage sources and said output terminals to one of a plurality of loads, said multiple switch means including a plurality of conductive areas, a plurality of first and second fixed in location contacts positioned about said plurality of conductive areas, said first fixed contacts being operatively associated with a plurality of output terminals of said voltage sources, said first fixed contacts being adapted for connection to said amplifier output terminals, said first fixed contact being slidably engageable with said conductive areas, said second fixed in location contacts being operatively associated with a plurality of input terminals of said multiple switch means, said second fixed contacts being adapted for connection to said amplifier input terminals, said second fixed contacts being slidably engageable with said conductive areas, and means for rotating said conductive areas relative to said fixed contacts.

11. The selector of claim 10 further including a second multiple switch means for connection to a second gradient amplifier having signal input terminals and power output terminals, said second multiple switch means for selectively connecting said second amplifier input terminals to one of said plurality of voltage sources and said output terminals to one of said plurality of conductive areas, a plurality of other first and second fixed in location contacts positioned about said conductive areas, said first fixed contacts of said second multiple switch means being operatively associated with a plurality of output terminals of said voltage sources, said first fixed contacts being adapted for connection to said second amplifier output terminals, said first fixed contacts of said second multiple switch means being slidably engageable with said conductive areas, said second fixed contacts of said second multiple switch means being operatively associated with a plurality of input terminals of said second multiple switch means, said second fixed contacts being adapted for connection to said second amplifier input terminals, said second fixed contacts of said second multiple switch means being slidably engageable with said conductive areas, and second means for rotating said conductive areas of said second multiple switch means, said first fixed contacts of said second switch means connected to second fixed contacts of said first switch means.

12. A selector for connection to a gradient amplifier having signal input terminals and output terminals, said selector including multiple switch means for selectively connecting said amplifier input terminals to one of a plurality of loads, said multiple switch means including a plurality of conductive areas, and means for rotating said areas about an axis, a plurality of first and second fixed contacts positioned about said conductive areas, said fixed in location contacts slidably engaging said conductive areas, a second multiple switch means for connection to a second gradient amplifier having signal input terminals and power output terminals, said second multiple switch means for selectively connecting said second amplifier input terminals to one of said plurality of voltage sources and said output terminals to one of said plurality of loads, said second multiple switch means including a plurality of conductive areas, and means for rotating said areas about an axis, a plurality of other first and second fixed in location contacts positioned about said conductive areas for slidably engaging said conductive areas, wherein said first fixed contacts of said second switch means being connected to said second fixed contacts of said first switch means.

* * * * *